(12) United States Patent
Liao et al.

(10) Patent No.: US 12,519,008 B2
(45) Date of Patent: Jan. 6, 2026

(54) TRENCH ISOLATION STRUCTURES AND METHODS OF MAKING THEREOF

(71) Applicant: GlobalFoundries Singapore Pte. Ltd., Singapore (SG)

(72) Inventors: Hung Chang Liao, Singapore (SG); Shiang Yang Ong, Singapore (SG); Jianbo Zhou, Singapore (SG); Zhongxiu Yang, Singapore (SG); Sivakami Subramanian, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 752 days.

(21) Appl. No.: 17/810,838

(22) Filed: Jul. 6, 2022

(65) Prior Publication Data
US 2024/0014066 A1    Jan. 11, 2024

(51) Int. Cl.
*H01L 21/762* (2006.01)
*H01L 21/763* (2006.01)

(52) U.S. Cl.
CPC ...... *H01L 21/76224* (2013.01); *H01L 21/763* (2013.01)

(58) Field of Classification Search
CPC ............... H01L 21/76224; H01L 21/763
See application file for complete search history.

(56) References Cited

U.S. PATENT DOCUMENTS 5,913,125 A * 6/1999 Brouillette ........ H01L 21/02381
257/E21.651

FOREIGN PATENT DOCUMENTS

JP    2003078031 A * 3/2003

OTHER PUBLICATIONS

JP-2003078031-A english translation.*
Borden et al., In-line Characterization of Preamorphous Implants (PAI), 2000 International Conference on Ion Implantation Technology Proceedings. Ion Implantation Technology—2000 (Cat. No.00EX432), 2000, pp. 635-638, IEEE.

* cited by examiner

*Primary Examiner* — Latanya N Crawford Eason
(74) *Attorney, Agent, or Firm* — Francois Pagette

(57) ABSTRACT

A trench isolation structure and method of making the same is provided. The trench isolation structure comprises a trench in a substrate, the trench having a bottom surface and sidewalls. A polycrystalline material is at least partially in the trench and an amorphous layer is over the polycrystalline material.

20 Claims, 4 Drawing Sheets

TRENCH ISOLATION STRUCTURES AND METHODS OF MAKING THEREOF

FIELD OF THE INVENTION

The present invention relates generally to isolation structures, and more particularly to trench isolation structures for semiconductor devices and methods of making trench isolation structures for semiconductor devices.

BACKGROUND

In semiconductor manufacturing processes, numerous electronic devices or circuit components are commonly built on a single substrate and electrically isolated from each other. These electronic devices or circuit components may then be connected in specific electronic paths to form integrated circuits having a desired circuit layout.

Isolation structures such as trench isolation structures may be used for electrically isolating electronic devices or circuit components. Trench isolation structures may generally be formed by forming a trench in the substrate between devices and filling in the trench with an electrically non-conductive material so as to form an electrical barrier between the devices. Further, trench isolation structures may be presented in the form of shallow trench isolation structures or deep trench isolation structures having relatively deeper and narrower trenches that may present various processing challenges such as inadequate filling of the trench or defects that affect subsequent processing of the trench and the surrounding device regions.

Improved trench isolation structures for electrical isolation of electronic devices and methods for making such trench isolation structures are needed.

SUMMARY

According to an embodiment of the invention, a trench isolation structure comprises a trench in a substrate, the trench having a bottom surface and sidewalls. A polycrystalline material is at least partially in the trench and an amorphous layer is over the polycrystalline material.

According to another embodiment of the invention, a trench isolation structure comprises a trench in a substrate, the trench having a bottom surface and sidewalls. A first polycrystalline material is at least partially in the trench and a second polycrystalline material is on the first polycrystalline material. An amorphous layer is over the first polycrystalline material.

According to yet another embodiment of the invention, a method of fabricating a trench isolation structure is provided. The method includes forming a trench in a substrate, the trench having a bottom surface and sidewalls. The method further includes depositing a polycrystalline material at least partially in the trench and forming an amorphous layer over the polycrystalline material.

BRIEF DESCRIPTION OF THE DRAWINGS

The accompanying drawings illustrate examples of various non-limiting embodiments of the invention and constitute a part of the specification. The drawings, along with the above general description of the invention, and the following detailed description of the various embodiments, serve to explain the examples of the non-limiting embodiments of the invention. In the drawings, like reference numerals generally refer to like features in the various views.

Figure 1:
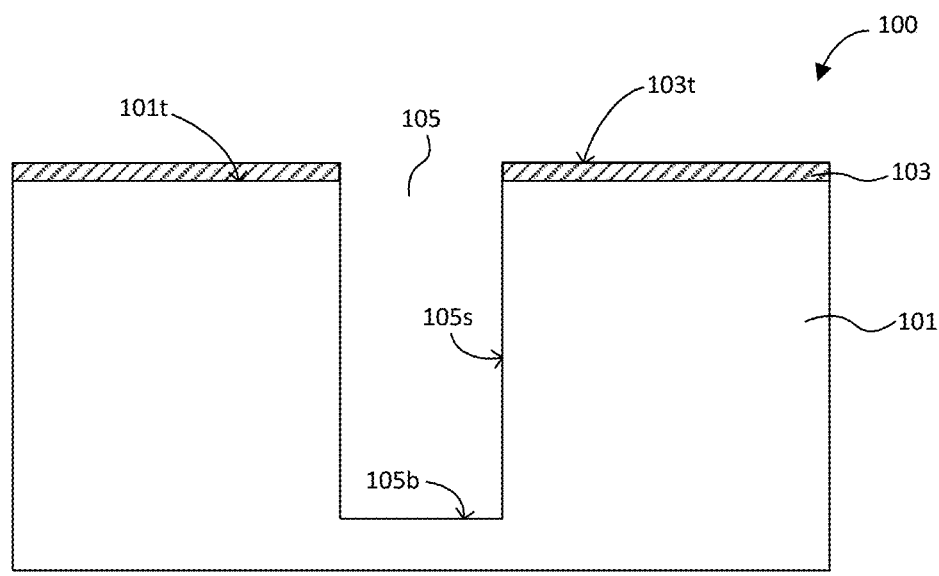
FIGS. 1-8 show simplified cross-sectional views representing exemplary process steps for fabricating a trench isolation structure, according to exemplary embodiments of the invention.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale and the dimensions of some of the elements in the drawings may be exaggerated relative to other elements to help improve understanding of the embodiments of the device.

DETAILED DESCRIPTION

FIGS. 1 through 8 illustrate an exemplary process in accordance with exemplary embodiments of the invention. Referring first to FIG. 1, a trench isolation structure 100 includes a trench 105 formed in a substrate 101. The substrate 101 may include but is not limited to silicon, germanium, silicon germanium (SiGe), silicon carbide, gallium arsenide, silicon-on-insulator (SOI) or any other suitable integrated circuit (IC) semiconductor substrates. In some embodiments, substrate 101 may be an undoped substrate. In some other embodiments, substrate 101 may be doped with a dopant, such as p-type dopants. For example, substrate 101 may be a p-type single crystalline silicon substrate. In some embodiments, the substrate 101 may be provided with other types of dopants or dopant concentrations.

A hard mask 103 may be formed over the top surface 101t of substrate 101 by a suitable deposition technique, for example, low pressure chemical vapor deposition (LPCVD), or plasma enhanced chemical vapor deposition (PECVD) processes. The hard mask 103 may include a dielectric material, such as silicon dioxide or silicon nitride. The material stack including the hard mask 103 over the substrate 101 may then be patterned by lithography and etching processes to define the trench 105 having a bottom surface 105b and at least one sidewall 105s. As part of the patterning process, an anisotropic material removal process may be utilized, for example, an anisotropic reactive ion etching (RIE) process, or a deep reactive ion etching (DRIE) process. In some embodiments, another patterning mask layer (not shown) may be utilized together with a suitable material removal process and subsequently removed from the top surface 103t of the hard mask 103. It is understood that process limitations may result in slightly sloped sidewalls 105s for the trench 105, as well as rounded edges or corners, in certain instances. In some embodiments, the hard mask 103 may be removed from the top surface 101t of the substrate at a later process stage.

In exemplary embodiments, the trench 105 may be a deep trench structure having a high aspect ratio of at least 10:1. In other embodiments, the trench 105 may have an aspect ratio of more than 20:1. In yet other embodiments, the trench 105 may be located within another trench having a lower aspect ratio, for example, a shallow trench having an aspect ratio of at least 1:2.

Figure 2:
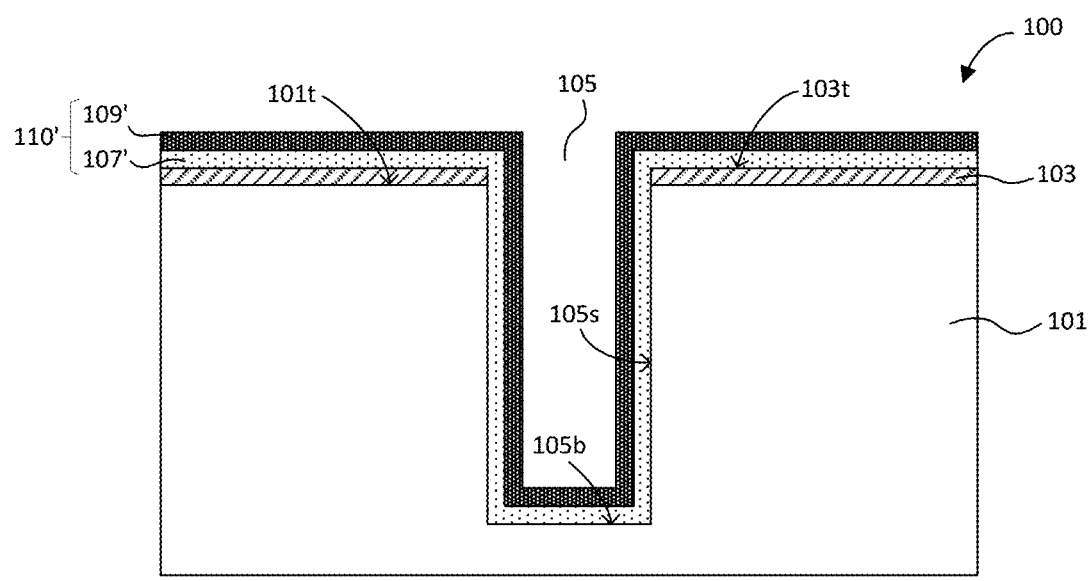

Next referring to FIG. 2, which shows the trench isolation structure 100 after subsequent processing steps to form a liner layer 110' over the substrate 101 and the trench 105 so that the sidewalls 105s of the trench 105 are lined with the liner layer 110'. The liner layer 110' may have a nominally uniform thickness and may conformally cover the top surface 103t of the hard mask 103, the sidewalls 105s and bottom surface 105b of the trench 105. The term "conformal" may refer to when a material layer conforms to or follows the contours of the surface that the material layer is in direct contact with, while maintaining a relatively uniform thickness over the surface. In some exemplary embodiments, the liner layer 110' may include a first liner layer 107' directly contacting the sidewalls 105s of the trench, and a second liner layer 109' over the first liner layer 107'. The second liner layer 109' is spaced from the sidewalls 105s by the first liner layer 107'. As an example, the first liner layer 107' may be a silicon oxide layer and the second liner layer 109' may be a tetraethyl orthosilicate (TEOS) layer. The silicon oxide layer may be formed to a thickness between about 500 to 600 Angstroms, using a suitable deposition process, for example, low pressure chemical vapor deposition (LPCVD), or plasma enhanced chemical vapor deposition (PECVD) process, and using tetraethyl orthosilicate (TEOS) as a source during the deposition process. In other embodiments, the liner layer 110' may be a single layer liner or include more than two liner layers. The liner layer 110' may include dielectric materials such as oxides, nitrides or combinations herein.

Figure 3:
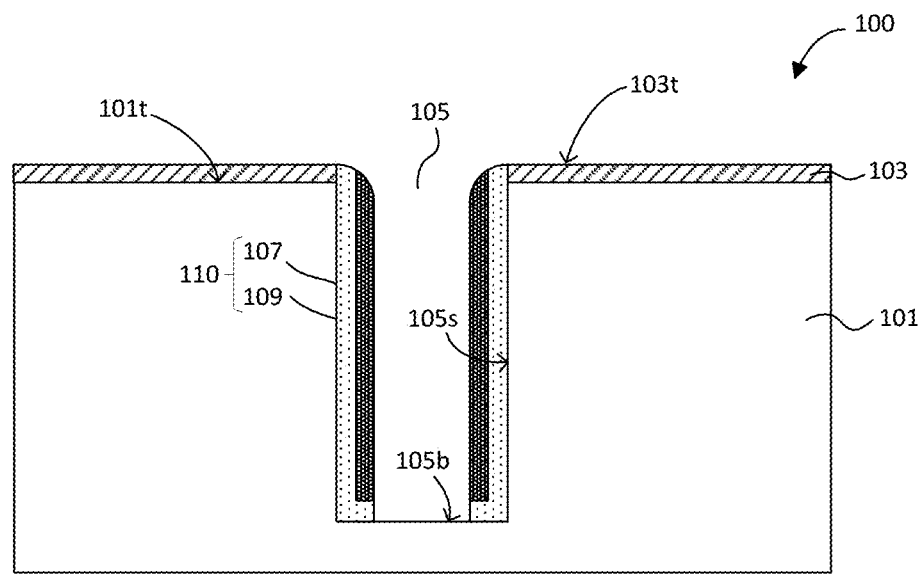

Referring now to FIG. 3, which shows the trench isolation structure 100 after subsequent processing steps to partially remove portions of the liner layer 110' to form the resulting liner layer 110 on the sidewalls 105s of the trench 105. A selected material removal process may be used to remove a top portion of the liner layer 110' and at least a portion of the bottom portion of the liner layer 110', forming a liner layer 110 on the sidewalls 105s of the trench 105. For example, the portion of liner layer 110' over the top surface 103t of the hard mask 103, and a portion of liner layer 110' over the bottom surface 105b of the trench 105 are removed by the material removal process, such that the top surface 103t and the center portion of the bottom surface 105b are devoid of the liner layer 110', and the vertical portion of the liner layer 110' is left behind on the sidewalls 105s. A suitable material removal process may include an anisotropic etching process, for example, a "spacer etch" process that preferentially removes more material in the vertically downward direction compared to the lateral direction. In an embodiment, the liner layer 110 is adjacent to and in direct contact with the sidewalls 105s.

Figure 4:
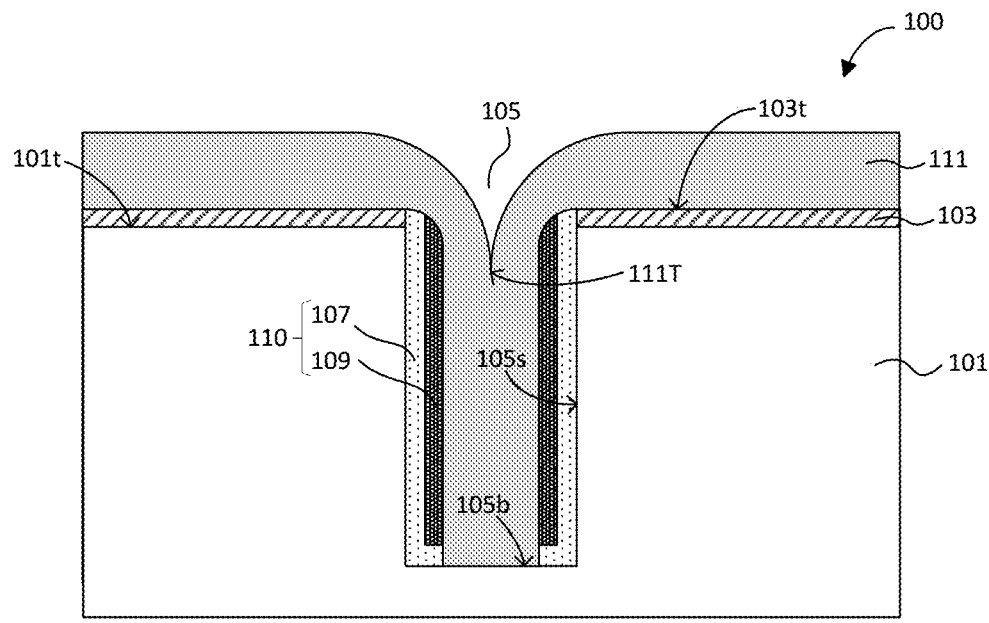

FIG. 4 shows a subsequent stage of the processing of the trench isolation structure 100 wherein a polycrystalline material 111 is formed over the sidewalls 105s of the trench 105 and over the top surface 101t of the substrate 101 by a suitable process which may provide good step coverage, particularly critical for the filling of high aspect ratio trenches or openings. In embodiments including the hard mask 103 over the substrate 101, the polycrystalline material 111 may be formed over and directly contact the hard mask 103. In some embodiments, the polycrystalline material 111 may directly contact and completely cover the liner layer 110 and the center portion of the bottom surface 105b of the trench 105. The polycrystalline material 111 may be spaced from the sidewalls 105s of the trench 105 by liner layer 110. For example, the liner layer 110 is between the polycrystalline material 111 and the sidewalls 105s, such that the polycrystalline material 111 may not be in direct contact with the sidewalls 105s. In other embodiments, the polycrystalline material 111 may cover the top surface 103t of the hard mask 103 but may not completely fill up the trench 105 and may at least partially fill up the trench 105 such that the lowest portion 111T of the top surface 111t of the polycrystalline material 111 may be lower than the top surface 101t of the substrate 101. In an embodiment, the polycrystalline material 111 may be polycrystalline silicon deposited by a chemical vapor deposition (CVD) process, such as a low-pressure chemical vapor deposition (LPCVD) process, or a plasma enhanced chemical vapor deposition (PECVD) process. The polycrystalline silicon may be doped with a selected dopant and may be doped in-situ or ex-situ, as the case may be. In an embodiment, the selected dopant may be an element having an atomic weight lighter than silicon (Si), for example boron (B). An exemplary value of the atomic weight of boron may be about 10.8, while an exemplary value of the atomic weight of silicon may be about 28.08. The polycrystalline material 111 may be formed to a thickness of about 7000 Angstroms to 9000 Angstroms above the top surface 103t of the hard mask 103 or the top surface 101t of the substrate 101 as the case may be.

In an exemplary embodiment, the polycrystalline silicon may be an in-situ boron doped polycrystalline silicon film deposited by the following exemplary deposition process; a wafer having the trench 105 shown in FIG. 3 is placed into a deposition chamber with the chamber pressure and temperature adjusted to suitable values, after which a reactant gas mixture comprising a silicon-containing gas, a boron-containing gas and a carrier gas is fed into the chamber. The silicon-containing gas may include silane ($SiH_4$), the boron-containing gas may include diborane ($B_2H_6$) and the carrier gas may include hydrogen ($H_2$) and/or helium (He). A polycrystalline silicon doped in-situ with boron atoms may then be deposited over the substrate 101 and within the trench 105 to form the structure as shown in FIG. 4.

Figure 5:
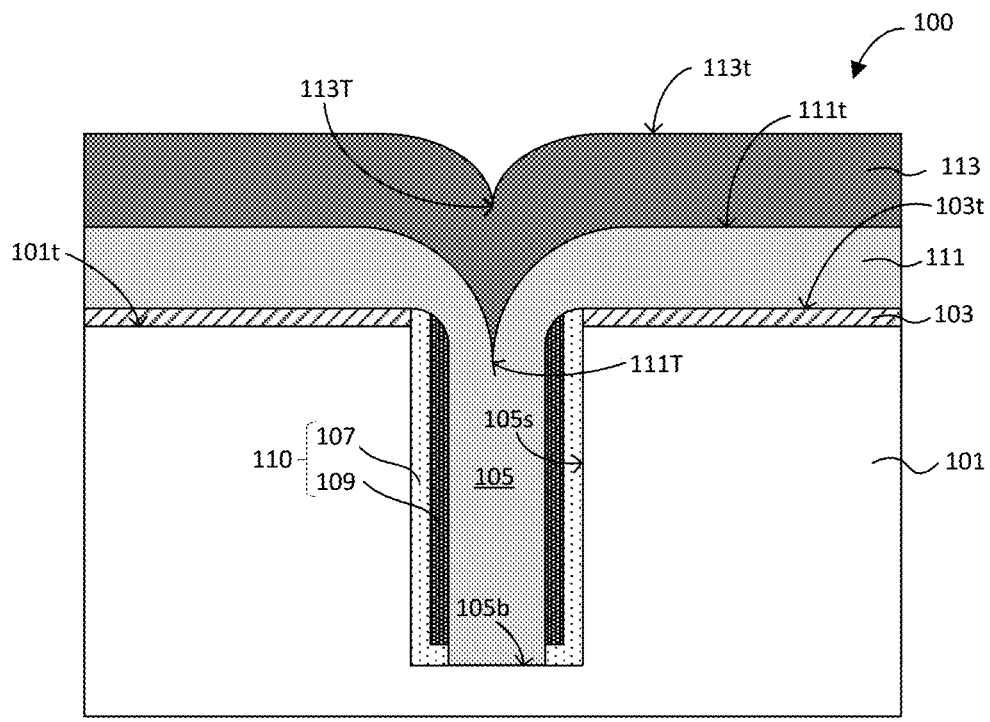

Next referring to FIG. 5 which illustrates a subsequent processing stage of the trench isolation structure 100, where the deposition of polycrystalline material 111 may be followed by the deposition of another polycrystalline material 113 over the polycrystalline material 111 using a suitable deposition process. In embodiments where hard mask 103 is present, the polycrystalline material 113 may be spaced from the hard mask 103 by the polycrystalline material 111. In an embodiment, the polycrystalline material 113 may directly contact and completely cover the polycrystalline material 111 at the region above the trench 105. In another embodiment, the trench 105 may be partially filled by polycrystalline material 111 and partially filled by polycrystalline material 113. For example, the trench 105 may be partially filled by polycrystalline material 111 having a lowest portion 111T being lower than the top surface 101t of the substrate 101. The polycrystalline material 113 may overlie the polycrystalline material 111 within the trench 105 so as to partially fill up the trench 105 such that the lowest surface 113T of the top surface 113t of the polycrystalline material 113 is higher than the top surface 101t of the substrate 101. In alternative embodiments, the polycrystalline material 113 may partially fill up the trench 105 such that the lowest surface 113T of the top surface of the polycrystalline material 113 is higher than the top surface 103t of the hard mask 103. In some embodiments, the polycrystalline material 113 may have the same composition as that of polycrystalline material 111. In other embodiments, the polycrystalline material 113 may have a different composition from polycrystalline material 111.

In accordance with exemplary embodiments, the deposition process for the polycrystalline material 113 may be the same process type as the deposition process for the polycrystalline material 111. In another embodiment, the deposition of polycrystalline material 113 may be a different process from that of the deposition of polycrystalline material 111. Exemplary processes for deposition of the polycrystalline material 113 include a chemical vapor deposition (CVD) process, such as a low-pressure chemical vapor deposition (LPCVD) process, or a plasma enhanced chemical vapor deposition (PECVD) process. The polycrystalline material 113 may also be doped, for example with boron or phosphorus, and may be doped in-situ or ex-situ, as the case may be. In some embodiments, the polycrystalline material 113 may be the same material as the polycrystalline material 111. In other embodiments, the polycrystalline material 113 may be a different material from the polycrystalline material 111. The polycrystalline material 113 may be formed to a thickness of about 7000 Angstroms to 9000 Angstroms above the top surface 111t of the polycrystalline material 111.

Figure 6:
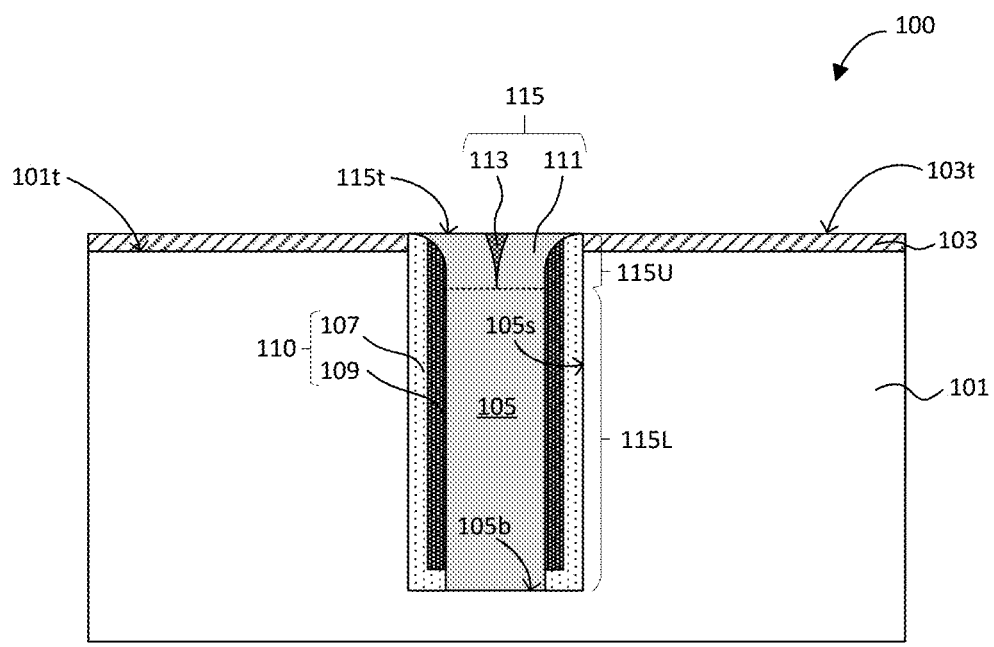

Now referring to FIG. 6 showing a subsequent stage of processing in which a suitable material removal process, such as a chemical mechanical planarization (CMP) process, has been performed to remove upper portions of the polycrystalline materials 111 and 113 and planarize the top surface, forming the polycrystalline material 115 having a top surface 115t that is substantially planar. Polycrystalline material 115 may include polycrystalline materials 111 and 113, and hence its top surface 115t may also include top surfaces of polycrystalline materials 111 and 113. In an embodiment, the top surface 103t of the hard mask 103 may act as the stopping layer for the planarization process. In other embodiments, the top surface 115t may be higher than the top surface 103t of the hard mask 103.

Figure 7:
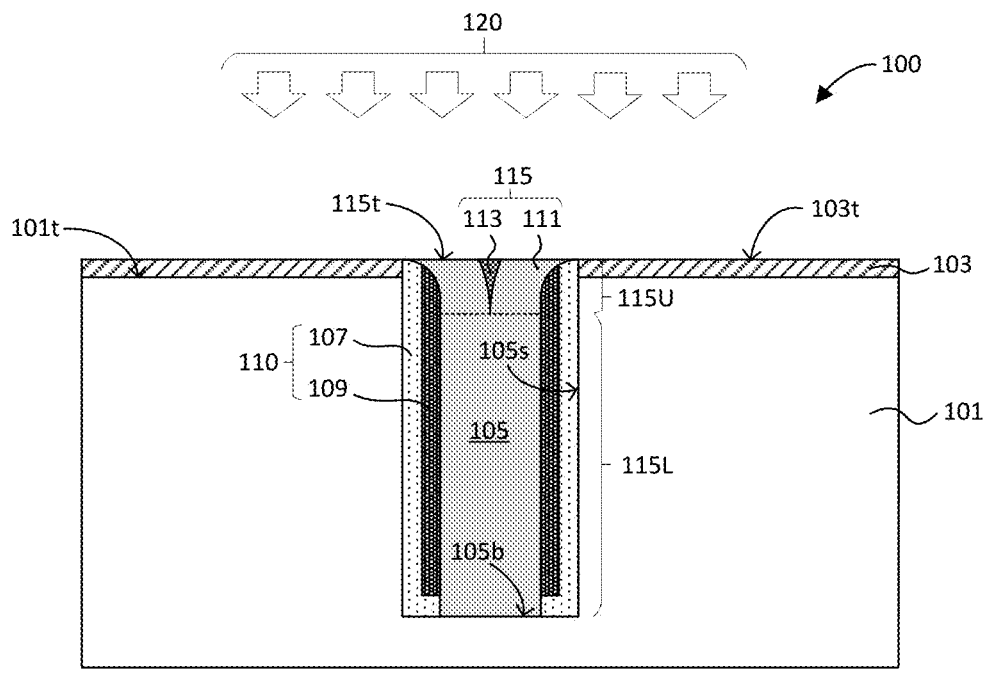

FIG. 7 illustrates a subsequent processing stage wherein a treatment process 120 is performed on the trench isolation structure 100. In an embodiment, the treatment process 120 may be suitable for forming an amorphous layer in an upper portion of the trench isolation structure 100, for example, at least in an upper portion 115U of the polycrystalline material 115. In some embodiments, the upper portion 115U may include both polycrystalline materials 111 and 113, while a lower portion 115L of the polycrystalline material 115 may include only polycrystalline material 111 and be devoid of polycrystalline material 113. In an embodiment, the treatment process may be suitable for converting at least a part of the upper portion 115U of the polycrystalline material 115 into an amorphous layer. In an exemplary embodiment, the treatment process 120 may include a doping technique such as an ion implantation process. For example, the treatment process 120, such as an ion implantation process, destroys the crystalline structure of the polycrystalline material 115 in at least a part of the upper portion 115U so as to form a continuous layer immediately under the top surface 115t having a non-crystalline amorphous structure. The treatment process 120 may include subjecting the top surface 115t of the polycrystalline material 115, to an ion implantation process with a dose between $0.5 \times 10^{15}/cm^2$ to $3 \times 10^{15}/cm^2$ using implant energies between approximately 5 KeV to 100 KeV. The selected implantation dose and energy may be sufficient to form an amorphous layer immediately under the top surface 115t of the polycrystalline material 115. The implant angle may range from 0 (zero) degrees to the vertical axis, to an angle of about 10 degrees to the vertical axis, and the ion species for the ion implantation process may include an element having an atomic weight heavier than silicon (Si). For example, the ion species may include germanium (Ge), argon (Ar) or gallium (Ga) ions. In embodiments where a selected dopant is used in the deposition of the polycrystalline materials 111 and 113 (collectively referred to as polycrystalline material 115), the ion species may be different from the dopant species present in the polycrystalline material 115.

Still referring to FIG. 7, after the treatment process 120, the trench isolation structure 100 may be further subjected to another material removal process to recess the top surface of the trench isolation structure 100 by about 150 to 1000 Angstroms. A suitable material removal process may include an etching process, such as a dry-etch process as an example.

Figure 8:
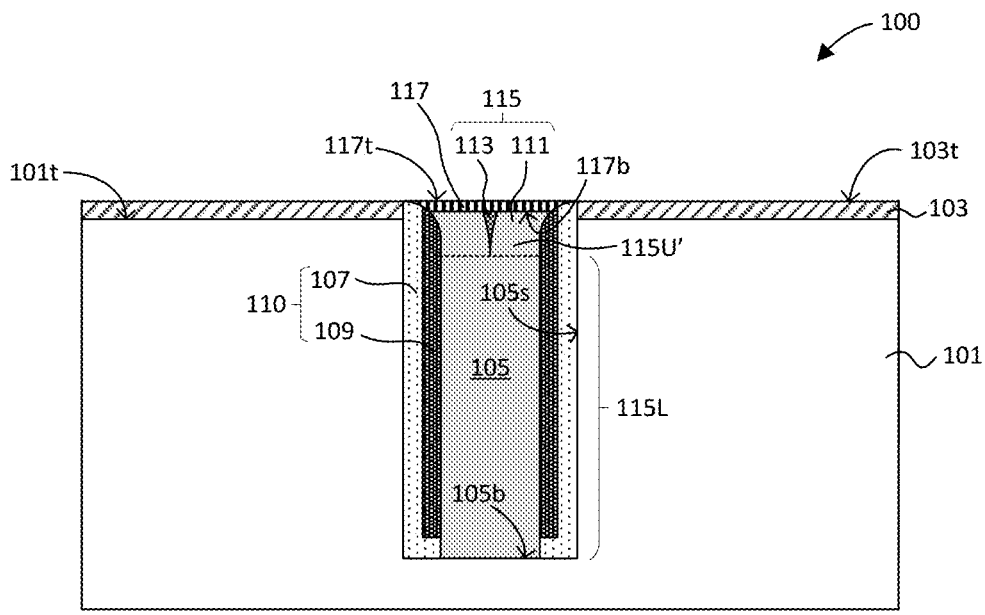

FIG. 8 shows the resulting trench isolation structure 100 after the material removal process wherein an amorphous layer 117 remains over the polycrystalline material 115. In some embodiments, the material removal process may remove only a portion of the amorphous layer in the upper portion of the trench isolation structure 100. In other embodiments, the entire amorphous layer is completely removed. In exemplary embodiments, the top surface 117t of the amorphous layer 117 is lower than the top surface 115t of the polycrystalline material 115 after the planarization process as previously described and shown in FIG. 6. In some embodiments, the top surface 117t may be lower than the top surface 103t of the hard mask 103. The amorphous layer 117 may be a continuous layer having a top surface 117t and bottom surface 117b opposite the top surface 117t. In some embodiments, the formation of the amorphous layer 117 results in a modified upper portion 115U' of the polycrystalline material 115 having a crystalline-amorphous interface with the amorphous layer 117, which is also the bottom surface 117b of the amorphous layer 117. In some embodiments, the amorphous layer 117 may be in direct contact with polycrystalline material 111. In other embodiments, the amorphous layer 117 may extend over the polycrystalline material 113. For example, the amorphous layer 117 may be in direct contact with and have an interface with both polycrystalline material 111 and polycrystalline material 113. In some embodiments, the amorphous layer 117 may have a thickness measured from the top surface 117t to the bottom surface 117b. In an example, the thickness of amorphous layer 117 may be between 200 to 1200 Angstroms.

In some embodiments where the amorphous layer 117 is formed via an ion implantation process using a selected ion species as aforementioned in earlier paragraphs, the ion species may be present in both the amorphous layer 117 and polycrystalline material 115. The concentration of the ion species in the amorphous layer 117 may be higher than in the polycrystalline material 115. In some embodiments, the concentration of the ion species in the upper portion 115U' may be higher than that in a lower portion 115L of the polycrystalline material 115 which is spaced from the amorphous layer. In yet another embodiment, the lower portion of the polycrystalline material 115 may be devoid of the ion species. As an example, the lower portion 115L of the polycrystalline material may be devoid of the ion species while the amorphous layer 117 includes the ion species. In other embodiments, the ion species may be absent in the polycrystalline material 115.

Descriptions of embodiments herein are meant to be taken as examples and not meant to be limiting as such. Terms such as "vertical", "horizontal", "top", "bottom", "over", "under", and the like in the description and in the claims, if any, are used for establishing a frame of reference and not necessarily for describing permanent relative positions. The term "horizontal" is defined as a plane parallel to a conventional plane of a semiconductor substrate, rather than its actual three-dimensional orientation in space. The terms "vertical" and "normal" refer to a plane perpendicular to the horizontal. The term "lateral" refers to a direction parallel to the horizontal plane.

Terms such as "connected" or "coupled" indicate that a feature may be directly connected or coupled to or with the other feature, or one or more intervening features may also be present. A feature may be "directly connected" or "directly coupled" to or with another feature if intervening features are absent. A feature may be "indirectly connected" or "indirectly coupled" to or with another feature if at least one intervening feature is present. Terms such as "on" or "contacting" indicate that a feature may be directly on or in direct contact with the other feature, or one or more intervening features may also be present. A feature may be "directly on" or in "direct contact" with another feature if intervening features are absent. A feature may be "indirectly on" or in "indirect contact" with another feature if at least one intervening feature is present.

The terms "first", "second", "third" and the like in the description and in the claims, if any, are used for distinguishing between similar elements and not necessarily for describing a particular sequential or chronological order as required. A method described herein is not necessarily limited in practice to the exact order or number of steps as have been listed, and certain steps may possibly be omitted and/or certain other steps not described herein may possibly be performed in actual practice. Terms such as "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A trench isolation structure comprising:
   a trench in a substrate, the trench having a bottom surface and sidewalls;
   a polycrystalline material at least partially in the trench;
   an amorphous layer over the polycrystalline material; and
   an ion species having an atomic weight heavier than silicon.

2. The trench isolation structure of claim 1, further comprising a dopant having an atomic weight lighter than silicon.

3. The trench isolation structure of claim 1, wherein the polycrystalline material comprises a lower portion and an upper portion, and the lower portion is devoid of the ion species.

4. The trench isolation structure of claim 1, wherein the ion species has a higher concentration in the amorphous layer than in the polycrystalline material.

5. The trench isolation structure of claim 1, wherein the trench is a deep trench structure having an aspect ratio of at least 10:1.

6. The trench isolation structure of claim 1, wherein the polycrystalline material comprises an element that is in the amorphous layer.

7. The trench isolation structure of claim 1, wherein the sidewalls of the trench are lined with a liner layer comprising an oxide.

8. The trench isolation structure of claim 7, wherein the liner layer comprises more than one layer.

9. A trench isolation structure comprising:
   a trench in a substrate, the trench having a bottom surface and sidewalls;
   a first polycrystalline material at least partially in the trench;
   a second polycrystalline material on the first polycrystalline material; and
   an amorphous layer over the first polycrystalline material, wherein the amorphous layer extends over the second polycrystalline material.

10. The trench isolation structure of claim 9, wherein the sidewalls of the trench are lined with a liner layer and the first polycrystalline material is in direct contact with the liner layer.

11. The trench isolation structure of claim 10, wherein the second polycrystalline material is spaced from the liner layer by the first polycrystalline material.

12. The trench isolation structure of claim 9, wherein the amorphous layer is in direct contact with the first polycrystalline material and the second polycrystalline material.

13. The trench isolation structure of claim 9, wherein the amorphous layer comprises an ion species having an atomic weight heavier than silicon.

14. The trench isolation structure of claim 9, wherein the trench is a deep trench structure having an aspect ratio of at least 10:1.

15. The trench isolation structure of claim 9, further comprising a dopant having an atomic weight lighter than silicon.

16. A method of fabricating a trench isolation structure comprising:
   forming a trench in a substrate, the trench having a bottom surface and sidewalls;
   depositing a polycrystalline material at least partially in the trench; and
   forming an amorphous layer over the polycrystalline material, wherein the amorphous layer comprises an ion species having an atomic weight heavier than silicon.

17. The method of claim 16, wherein the depositing of the polycrystalline material comprises the deposition of a first polycrystalline layer followed by the deposition of a second polycrystalline layer over the first polycrystalline layer.

18. The method of claim 16, further comprising forming of a liner layer on the sidewalls of the trench before the depositing of the polycrystalline material.

19. The method of claim 16, further comprising a planarization process after the depositing of the polycrystalline material.

20. The method of claim 16, wherein the forming of the amorphous layer comprises an ion implantation process.

* * * * *